United States Patent
Wang et al.

(10) Patent No.: US 10,651,248 B2
(45) Date of Patent: May 12, 2020

(54) ORGANIC ELECTROLUMINESCENT DISPLAY PANEL AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lina Wang, Beijing (CN); Liang Zhang, Beijing (CN); Haotian Wang, Beijing (CN); Zifeng Wang, Beijing (CN)

(73) Assignees: ORDOS YUANSHENG OPTOELECTRONICS TECHNOLOGY CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/332,876

(22) PCT Filed: May 3, 2018

(86) PCT No.: PCT/CN2018/085395
§ 371 (c)(1),
(2) Date: Mar. 13, 2019

(87) PCT Pub. No.: WO2018/210132
PCT Pub. Date: Nov. 22, 2018

(65) Prior Publication Data
US 2019/0363143 A1    Nov. 28, 2019

(30) Foreign Application Priority Data
May 15, 2017  (CN) ............... 2017 1 0346827

(51) Int. Cl.
*H01L 21/00* (2006.01)
*H01L 27/32* (2006.01)
*H01L 51/52* (2006.01)

(52) U.S. Cl.
CPC ...... *H01L 27/3244* (2013.01); *H01L 51/5271* (2013.01)

(58) Field of Classification Search
CPC ............. H01L 27/3244; H01L 51/5271; H01L 27/3216
See application file for complete search history.

(56) References Cited

U.S. PATENT DOCUMENTS

| 7,537,504 B2 * | 5/2009 | Becken ............... H01L 51/5246 445/24 |
| 9,379,353 B2 * | 6/2016 | Hsiao .................. H01L 51/5246 |

(Continued)

FOREIGN PATENT DOCUMENTS

| CN | 103681756 A | 3/2014 |
| CN | 104064687 A | 9/2014 |

(Continued)

OTHER PUBLICATIONS

First Office Action for Chinese Patent Application No. 201710346827.1 dated Feb. 11, 2018.

(Continued)

*Primary Examiner* — Laura M Menz
(74) *Attorney, Agent, or Firm* — Calfee, Halter & Griswold LLP (57) ABSTRACT

An organic electroluminescent display panel and a display device is disclosed. The organic electroluminescent display panel includes: a pixel array; a packaging adhesive surrounding the pixel array; and a laser reflector located between the pixel array and the packaging adhesive. The laser reflector includes a top surface inclined toward the (Continued)

packaging adhesive which reflects the edge portion of the laser to the packaging adhesive.

18 Claims, 4 Drawing Sheets

(56) References Cited

U.S. PATENT DOCUMENTS

| | | |
|---|---|---|
| 2005/0116221 A1 | 6/2005 | Kim et al. |
| 2014/0061612 A1* | 3/2014 | Yamazaki ............ H01L 51/5243 257/40 |
| 2015/0296573 A1* | 10/2015 | Hsiao .................. H01L 51/5246 359/850 |
| 2016/0329518 A1* | 11/2016 | Xiao .................... H01L 51/5243 |
| 2019/0363143 A1* | 11/2019 | Wang .................. H01L 51/5237 |

FOREIGN PATENT DOCUMENTS

| | | | |
|---|---|---|---|
| CN | 104916662 A | 9/2015 | |
| CN | 106206993 A | 12/2016 | |
| CN | 106935731 A | 7/2017 | |
| WO | WO-2018210132 A1 * | 11/2018 | ............. H01L 27/32 |

OTHER PUBLICATIONS

Search Report and Written Opinion for International Application No. PCT/CN2018/085395 dated Aug. 8, 2018.

\* cited by examiner

ORGANIC ELECTROLUMINESCENT DISPLAY PANEL AND DISPLAY DEVICE

RELATED APPLICATIONS

The present application is the U.S. national phase entry of the international application PCT/CN2018/085395, with an international filing date of May 3, 2018, which claims the benefit of Chinese Patent Application No. 201710346827.1, filed on May 15, 2017, the entire disclosures of which are incorporated herein by reference.

TECHNICAL FIELD

The present disclosure relates to the field of display technology, and particularly to an organic electroluminescent display panel and a display device.

BACKGROUND

At present, rigid organic electroluminescent display panels (for example, OLED display panels) generally use glass adhesive as a packaging material, and are effectively packaged by laser sintering. Under the condition that the laser moving speed is constant, the energy absorbed by the package area is related to the laser energy and the laser running trajectory.

Figure 1:
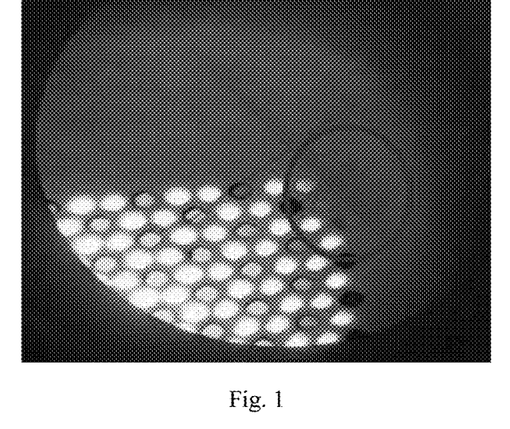
FIG. 1 shows light emission of pixels on a corner of an organic electroluminescent display panel during a lighting detection in the related art.
Figure 2:
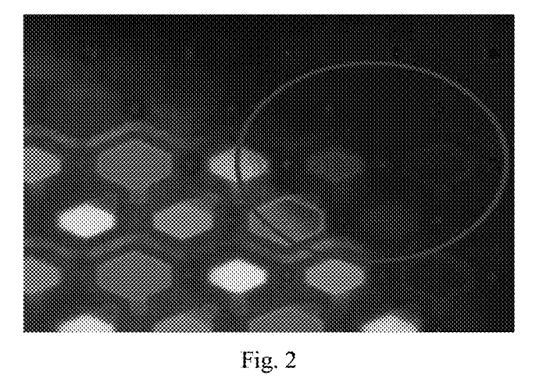
FIG. 2 shows the R/G/B excitation of the organic electroluminescent display panel of the related art under a fluorescence microscope.
Figure 3:
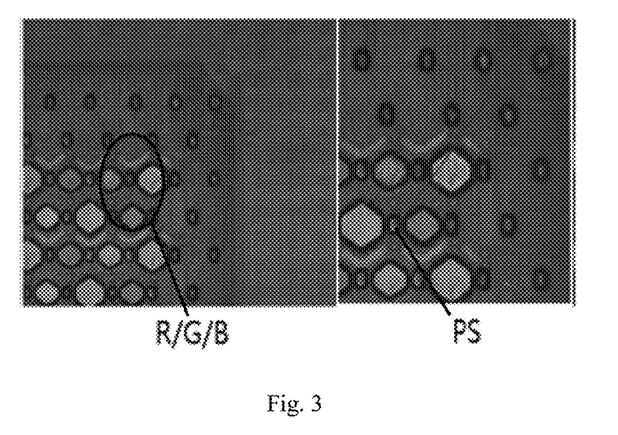
FIG. 3 shows the R/G/B luminescence and PS of the organic electroluminescent display panel of the related art under an ultraviolet microscope.

In actual production, a laser is used to irradiate the glass adhesive in the package area. At the corner of the OLED display panel, due to the influence of the laser running trajectory, the inner corner is more irradiated by the laser than the outer corner, where the pixels are most susceptible to burns. Under the lighting detection, referring to FIG. 1, the pixels on the corner emit light abnormally. Under a fluorescence microscope, referring to FIG. 2, the R/G/B excitation is weak. Under an ultraviolet microscope, referring to FIG. 3, the R/G/B color is normal, the vapor deposition is normal, but some of the post spacers (also called PS) are abnormal, which affects the quality of light emission. In addition, in actual production, after a large amount of laser energy instantaneously passes through the package area, the temperature gradient of the glass adhesive is large. This results in a large stress that directly affects the mechanical quality of the device.

Therefore, research on organic electroluminescent display panels needs to be further studied.

SUMMARY

In an aspect of the present disclosure, an organic electroluminescent display panel is provided. According to an exemplary embodiment of the present disclosure, the organic electroluminescent display panel includes: a pixel array; a packaging adhesive surrounding the pixel array; and a laser reflector located between the pixel array and the packaging adhesive. The laser reflector includes a top surface inclined toward the packaging adhesive.

In some exemplary embodiments, the laser reflector is in direct contact with the pixel array, and the packaging adhesive is in direct contact with the laser reflector.

In some exemplary embodiments, a maximum height of the top surface is equal to or less than a height of the packaging adhesive.

In some exemplary embodiments, the top surface is one of a convex surface, a planar surface, and a concave surface.

In some exemplary embodiments, the top surface includes a convex surface at a position corresponding to a corner of the pixel array.

In some exemplary embodiments, a width of the laser reflector is less than or equal to 10% of a width of the packaging adhesive.

In some exemplary embodiments, a material of the laser reflector includes at least one of $MoO_3$, $SiN_x$, and $SiO_2$.

In some exemplary embodiments, the laser reflector is formed by one of a photolithography process, a coating process, a deposition process, and a printing process.

In some exemplary embodiments, the organic electroluminescent display panel further includes a cutting portion surrounding the packaging adhesive.

In another exemplary embodiment, a display device is provided. According to an embodiment of the present disclosure, the display device includes the organic electroluminescent display panel as described in the above-mentioned embodiments.

DETAILED DESCRIPTION OF THE DISCLOSURE

Exemplary embodiments are described in detail below. The exemplary embodiments described below are illustrative only and are not to be construed as limiting the disclosure. The specific techniques or conditions not indicated in the examples can be carried out according to the techniques or conditions described in the literature in the art or in accordance with the product specifications. The reagents or instruments used without indicating the manufacturer are conventional products that can be obtained commercially.

The present disclosure aims to solve at least one of the technical problems in the related art to some extent. To this end, an object of the present disclosure is to provide an organic electroluminescent display panel which can effectively alleviate laser burn, reduce temperature gradient, or reduce stress in the package area.

In an exemplary embodiment, an organic electroluminescent display panel is provided. According to an exemplary embodiment, referring to FIG. 4 and FIG. 5, the organic electroluminescent display panel includes: a pixel array 10; a packaging adhesive 20 surrounding the pixel array; and a laser reflector 30 located between the pixel array 10 and the packaging adhesive 20. The laser reflector 30 includes a top surface 31 inclined toward the packaging adhesive 20. The laser reflector 30 can be used to reflect the edge portion of the laser to the packaging adhesive 20. Those skilled in the art will appreciate that the top surface 31 is reflective. For example, the top surface 31 can be a reflective smooth surface. In this way, the laser reflector can reflect the edge portion of the laser to the packaging adhesive; otherwise the edge portion of the laser may burn the pixels. The utilization of the laser is improved while burns on pixels are avoided. Therefore, energy is used efficiently, the energy loss is reduced, and the packaging performance of the glass adhesive is improved. Further, the temperature gradient of the glass adhesive can be reduced to avoid stress, and the packaging capability and the mechanical quality of the device can be improved.

It should be noted that, in the actual production process, the packaging adhesive is usually formed by a coating process and a laser sintering process. The width of the laser beam used in the laser sintering process is generally larger than the size of the packaging adhesive (referring to FIG. 5). As used herein, the term "edge portion of the laser" refers to the portion of the laser that irradiates outside of the package region, which is indicated with the reference sign 41 in FIG. 5.

According to an exemplary embodiment, the method of forming the packaging adhesive has no special requirements, and the person skilled in the art can select based on actual requirements. In some exemplary embodiments, the packaging adhesive may be formed by a single coating process or by multiple coating processes. There is no particular limitation on the specific type of packaging adhesive, and the packaging adhesive commonly used in the art can be used in the present disclosure. In some exemplary embodiments, the packaging adhesive may include, but is not limited to, glass adhesive or the like. Therefore, the packaging effect can be ideal, the raw materials are widely available and the cost is low.

According to exemplary embodiments, the terminology "pixel array" used herein refers to a plurality of pixel units arranged in an array on a light emitting region of an OLED display panel. Each of the pixel units may be a conventional pixel unit structure in the art. For example, three sub-pixel units of R, G, and B may be included in a pixel unit structure. The pixel unit structure may also include four sub-pixel units of R, G, B, and Y. The pixel unit structure may further include five sub-pixel units of R, G, B, Y, W, and the like. According to an embodiment of the present disclosure, the method of manufacturing the pixel array is not particularly limited, and a conventional process in the art may be employed.

Figure 4:
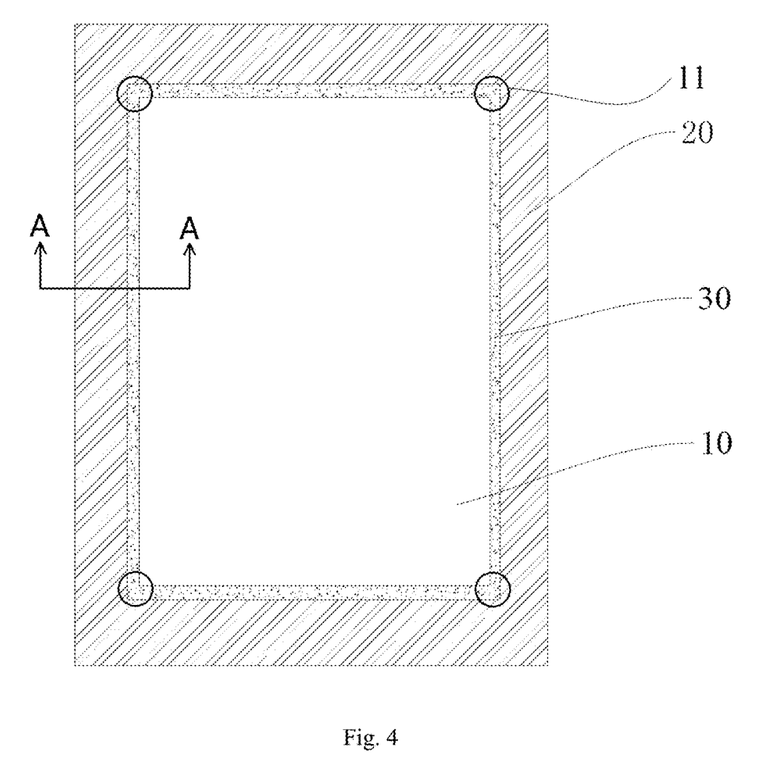
FIG. 4 is a schematic diagram of a planar structure of an organic electroluminescent display panel according to an exemplary embodiment.
Figure 5:
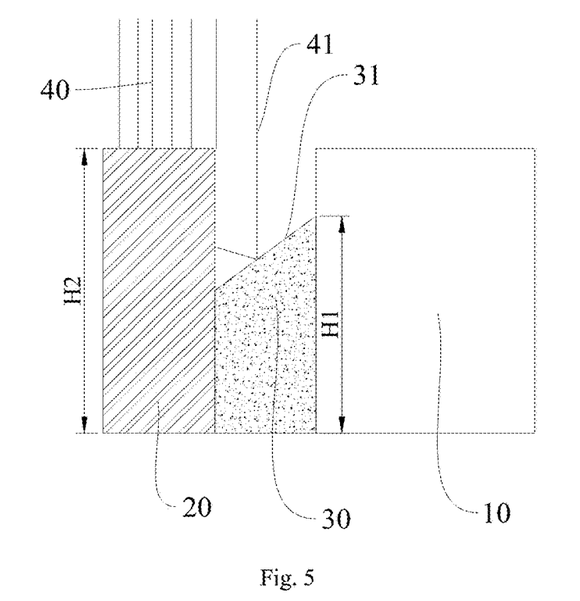
FIG. 5 is a schematic cross-sectional view of the organic electroluminescent display panel of the exemplary embodiment shown in FIG. 4 taken along AA line.

In some exemplary embodiments, as shown in FIG. 4 and FIG. 5, the laser reflector 30 is in direct contact with the pixel array 10, and the packaging adhesive 20 is in direct contact with the laser reflector 30. In this way, a compact organic electroluminescent display panel can be obtained.

Figure 6:
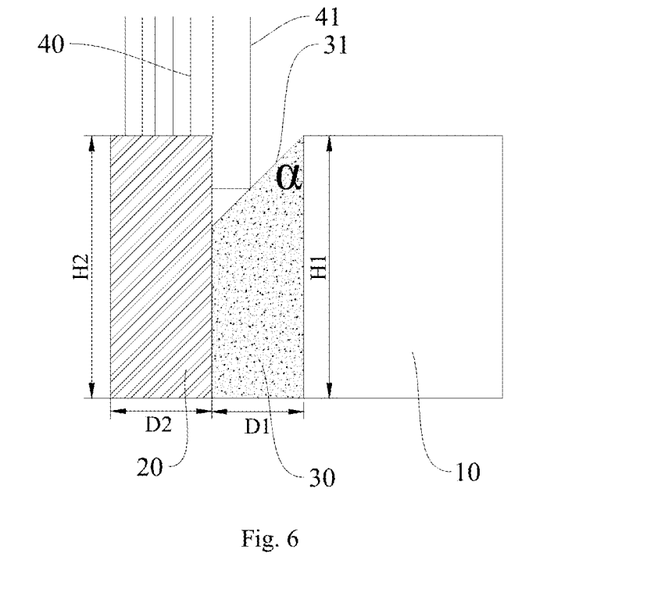
FIG. 6 is a schematic cross-sectional view of an organic electroluminescent display panel according to another exemplary embodiment.
Figure 8:
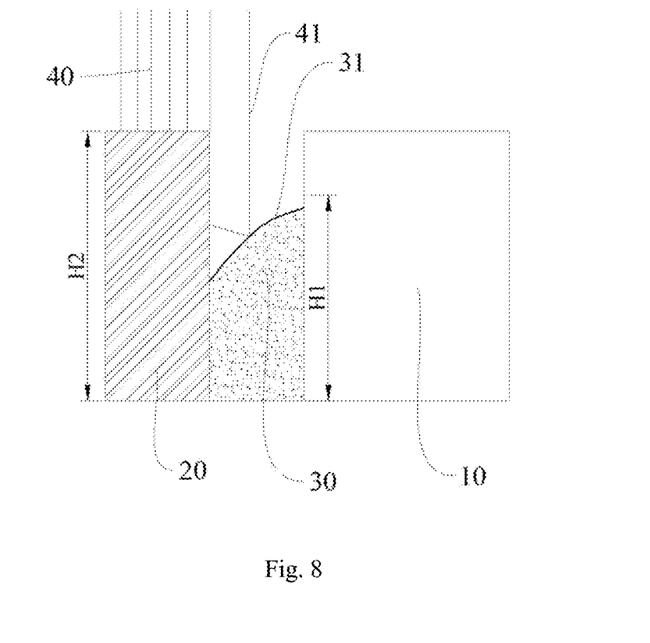
FIG. 8 is a schematic cross-sectional view of an organic electroluminescent display panel according to another exemplary embodiment.
Figure 9:
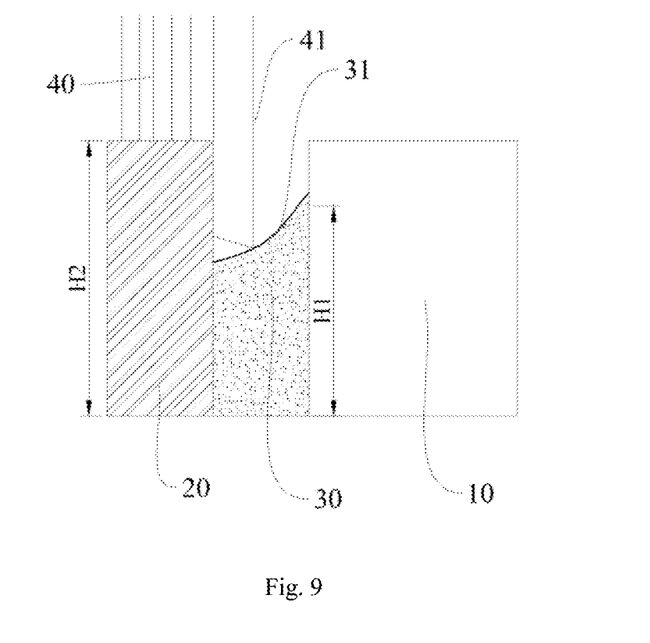
FIG. 9 is a schematic cross-sectional view of an organic electroluminescent display panel according to another exemplary embodiment.

In some exemplary embodiments, the top surface 31 is one of a convex surface (as shown in FIG. 8), a planar surface (as shown in FIG. 5 and FIG. 6), and a concave surface (as shown in FIG. 9). With a top surface in the form of a convex, planar, or concave surface, the edge portion of the laser can be effectively reflected to the packaging adhesive. For laser beams with a great intensity, a top surface in the form of a convex surface can be used to disperse the light intensity and provide uniform irradiation to the packaging adhesive.

In some exemplary embodiments, the top surface 31 includes a convex surface at a position (as indicated with the circles 11 in FIG. 4) corresponding to a corner of the pixel array. Those skilled in the art will appreciate that at other locations, the top surface 31 can be convex, planar, or concave.

According to an exemplary embodiment, the material of the laser reflector is not particularly limited as long as the laser reflector is not softened by heat under laser irradiation, there is no fluidity for the laser reflector under external force, and the laser reflector can reflect the laser to the packaging adhesive. According to some exemplary embodiments, the material of the laser reflector may be a metal compound. Therefore, under laser irradiation, the laser reflector can still maintain good mechanical properties and has good reflection performance. In some exemplary embodiments, the metal compound may be $MoO_3$ (molybdenum oxide). The material of the laser reflector may include at least one of $MoO_3$, $SiN_x$ (silicon nitride), and $SiO_2$ (silicon dioxide). Therefore, under laser irradiation, the laser reflector can still maintain good mechanical properties and good reflection performance, and has a wide range of raw materials and low cost.

According to an exemplary embodiment, the method for forming the laser reflector is also not particularly limited, and those skilled in the art can select based on actual needs. According to some embodiments of the present disclosure, the laser reflector may be formed by a photolithography, coating, deposition, or printing process. The process is thus mature and easy to operate.

It can be understood by those skilled in the art that for an OLED display panel, a pixel array and a connection circuit are usually formed on the substrate by vapor deposition or the like, and then packaged with a cover glass. In the packaging process, the packaging adhesive may be formed on the substrate or on the cover glass. Similarly, according to an exemplary embodiment, the arrangement position of the laser reflector is also not particularly limited, and may be disposed on the cover glass or on the substrate.

According to exemplary embodiments of the present disclosure, the order of forming the laser reflector and the packaging adhesive is also not particularly limited, and those skilled in the art can select based on actual conditions. In some exemplary embodiments, the laser reflector is formed prior to a printing process of the packaging adhesive. In other exemplary embodiments, the laser reflector is formed after the packaging adhesive is printed.

In some exemplary embodiments, a maximum height of the top surface is equal to or less than a height of the packaging adhesive. In some exemplary embodiments, referring to FIG. 6, the maximum height H1 of the top surface 31 may be equal to the height H2 of the packaging adhesive 20. Thus, the laser reflector can protect the pixels from being burned, and can support the edge of the pixel array, reducing the possibility of Newton's rings. In other exemplary embodiments, referring to FIG. 5, the maximum height H1 of the top surface 31 may also be less than the height H2 of the packaging adhesive 20. In this way, the laser energy at the edge can be applied to reduce the temperature gradient of the packaging adhesive, and the energy can also be efficiently utilized, reducing the energy loss. The packaging performance of the glass adhesive is improved, and the packaging capability and the mechanical performance of the device can be improved.

In some exemplary embodiments, a width of the laser reflector is less than or equal to 10% of a width of the packaging adhesive. According to the exemplary embodiment, the width of the laser reflector is not particularly limited. Those skilled in the art can select the width of the laser reflector according to the actual condition, as long as the edge portion of the laser can be reflected to the packaging adhesive. In some exemplary embodiments, referring to FIG. 6, the width D1 of the laser reflector is no more than 10% of the width D2 of the packaging adhesive. Therefore, the laser reflector can reflect the laser at the edge of the packaging adhesive effectively, and the width of the peripheral region is not increase excessively, thereby saving the materials.

Figure 7:
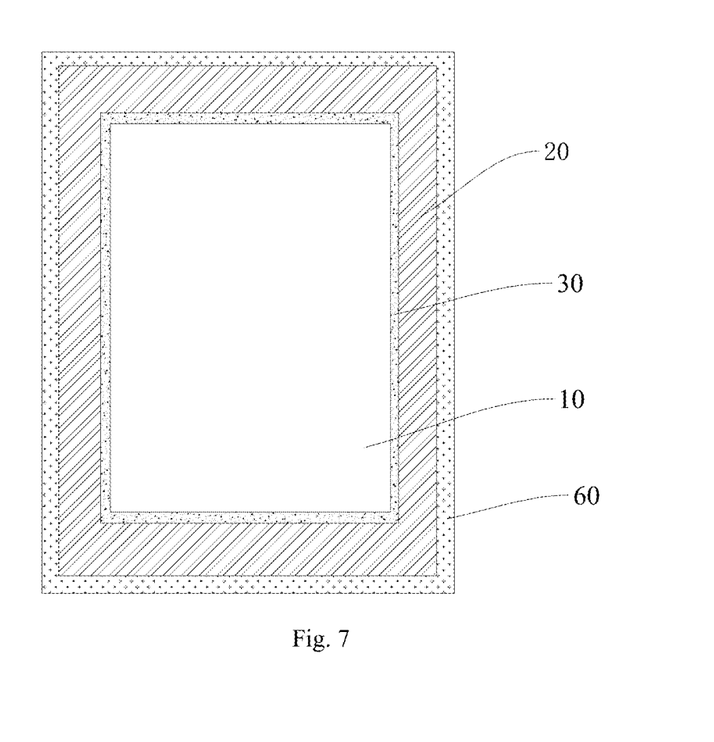
FIG. 7 is a schematic diagram of a planar structure of an organic electroluminescent display panel according to another exemplary embodiment.

In some exemplary embodiments, referring to FIG. 7, the organic electroluminescent display panel further includes a cutting portion 60 surrounding the packaging adhesive 20. In this way, it is advantageous to perform the cutting process for the organic electroluminescent display panel.

In another aspect of the present disclosure, a display device is provided. According to an exemplary embodiment, the display device includes the organic electroluminescent display panel as described in the above-mentioned embodiments. Therefore, the display device has excellent display quality and mechanical quality; the preparation process is mature and easy to industrialize. It will be understood by those skilled in the art that the display device has all the features and advantages of the organic electroluminescent display panel described above, and will not be further described herein.

According to exemplary embodiments, the specific type of the display device is not particularly limited, and may be any device or device having a display function in the art, such as, but not limited to, a mobile phone, a tablet computer, a computer display, a game console, a television, a display screen, a wearable device, and other living appliances or household appliances with display functions.

Of course, those skilled in the art can understand that the display device of the present disclosure may further include the necessary structures and components of the conventional display device in addition to the organic electroluminescent display panel described above. Taking a mobile phone as an example, in addition to the organic electroluminescent display panel of the present disclosure, it may also have structures and parts of a conventional mobile phone such as a touch screen, a casing, a CPU, a camera module, a fingerprint recognition module, a sound processing system, and the like.

In the description of the present specification, the description of the terms "an embodiment", "another embodiment", "exemplary embodiments" or the like means that the specific features, structures, materials or characteristics described in connection with the embodiments are included in at least one exemplary embodiment. In the present specification, the schematic representation of the above terms is not necessarily directed to the same embodiment or example. Furthermore, the particular features, structures, materials, or characteristics may be combined in a suitable manner in any one or more embodiments or examples. In addition, combinations of different embodiments or examples described in the specification and features of the various embodiments or examples may be combined by those skilled in the art without contradicting each other.

While the embodiments of the present disclosure have been shown and described above, it is understood that the above-described embodiments are illustrative and are not to be construed as limiting the scope of the disclosure. Variations, modifications, alterations and variations of the above-described embodiments may be made by those skilled in the art within the scope of the present disclosure.

What is claimed is:

1. An organic electroluminescent display panel, comprising:
   a pixel array;
   a packaging adhesive surrounding the pixel array; and
   a laser reflector located between the pixel array and the packaging adhesive; the laser reflector comprising a top surface inclined toward the packaging adhesive.

2. The organic electroluminescent display panel according to claim 1, wherein the laser reflector is in direct contact with the pixel array, and the packaging adhesive is in direct contact with the laser reflector.

3. The organic electroluminescent display panel according to claim 1, wherein a maximum height of the top surface is equal to or less than a height of the packaging adhesive.

4. The organic electroluminescent display panel according to claim 1, wherein the top surface is one of a convex surface, a planar surface, and a concave surface.

5. The organic electroluminescent display panel according to claim 1, wherein the top surface comprises a convex surface at a position corresponding to a corner of the pixel array.

6. The organic electroluminescent display panel according to claim 1, wherein a width of the laser reflector is less than or equal to 10% of a width of the packaging adhesive.

7. The organic electroluminescent display panel according to claim 1, wherein a material of the laser reflector comprises at least one of $MoO_3$, $SiN_x$, and $SiO_2$.

8. The organic electroluminescent display panel according to claim 1, wherein the laser reflector is formed by one of a photolithography process, a coating process, a deposition process, and a printing process.

9. The organic electroluminescent display panel according to claim 1, further comprising a cutting portion surrounding the packaging adhesive.

10. A display device comprising the organic electroluminescent display panel according to claim 1.

11. The display device according to claim 10, wherein the laser reflector is in direct contact with the pixel array, and the packaging adhesive is in direct contact with the laser reflector.

12. The display device according to claim 10, wherein a maximum height of the top surface is equal to or less than a height of the packaging adhesive.

13. The display device according to claim 10, wherein the top surface is one of a convex surface, a planar surface, and a concave surface.

14. The display device according to claim 10, wherein the top surface comprises a convex surface at a position corresponding to a corner of the pixel array.

15. The display device according to claim 10, wherein a width of the laser reflector is less than or equal to 10% of a width of the packaging adhesive.

16. The display device according to claim 10, wherein a material of the laser reflector comprises at least one of $MoO_3$, $SiN_x$, and $SiO_2$.

17. The display device according to claim 10, wherein the laser reflector is formed by one of a photolithography process, a coating process, a deposition process, and a printing process.

18. The display device according to claim 10, further comprising a cutting portion surrounding the packaging adhesive.

\* \* \* \* \*

UNITED STATES PATENT AND TRADEMARK OFFICE
CERTIFICATE OF CORRECTION

PATENT NO. : 10,651,248 B2
APPLICATION NO. : 16/332876
DATED : May 12, 2020
INVENTOR(S) : Lina Wang et al.

Page 1 of 1

It is certified that error appears in the above-identified patent and that said Letters Patent is hereby corrected as shown below:

On the Title Page

Please correct the name of the first Assignee in item (73) to read as follows:
ORDOS YUANSHENG OPTOELECTRONICS CO., LTD.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*